United States Patent [19]

Yamashita et al.

[11] 4,278,754
[45] Jul. 14, 1981

[54] RESISTS AND METHOD OF MANUFACTURING SEMICONDUCTOR ELEMENTS BY USING THE SAME

[75] Inventors: Yoshio Yamashita; Mitsumasa Kunishi; Ryuji Kawazu, all of Tokyo, Japan

[73] Assignee: Oki Electric Industry Co., Ltd., Tokyo, Japan

[21] Appl. No.: 58,814

[22] Filed: Jul. 17, 1979

[30] Foreign Application Priority Data

Jul. 20, 1978 [JP] Japan .................................. 53-87753

[51] Int. Cl.³ .............................................. G03C 5/00
[52] U.S. Cl. .................... 430/323; 427/43.1; 430/280; 430/281; 430/296; 430/297; 430/313; 430/317; 430/318; 430/326; 430/328; 430/330; 430/942
[58] Field of Search ................. 427/44, 272, 273, 43.1; 430/270, 280, 281, 285, 296, 297, 313, 317, 323, 942, 330, 328, 326, 318

[56] References Cited

U.S. PATENT DOCUMENTS

| | | | |
|---|---|---|---|
| 3,914,462 | 10/1975 | Morishita et al. | 427/273 X |
| 3,916,035 | 10/1975 | Brewer | 427/273 X |
| 3,916,036 | 10/1975 | Gipstein et al. | 427/273 X |
| 3,996,393 | 12/1976 | Cortellino et al. | 430/296 |
| 4,011,351 | 3/1977 | Gipstein et al. | 430/296 |
| 4,090,936 | 5/1978 | Barton | 430/296 X |
| 4,096,290 | 6/1978 | Fredericks | 427/273 X |
| 4,125,672 | 11/1978 | Kakuchi et al. | 427/273 X |

*Primary Examiner*—Edward C. Kimlin
*Attorney, Agent, or Firm*—Wenderoth, Lind & Ponack

[57] ABSTRACT

A resist utilized to prepare semiconductor elements or the like comprises a copolymer of, for example, 2,3 dibromo-n-propyl methacrylate and methylmethacrylate. The resist is applied onto a substrate to form a copolymer resist layer, the copolymer resist layer is irradiated with ionizing radiations, the irradiated portions of the copolymer resist layer are dissolved to form a positive pattern, the positive pattern is heated in inert atmosphere to cause crosslinking reaction of reactive radicals remaining in the copolymer resist, and then the assembly is etched with a liquid etchant to form an etched pattern on the substrate. Alternatively, the positive pattern and the underlying substrate are treated with plasma or ions to cause a crosslinking reaction of reactive radicals remaining in the copolymer resist to simultaneously etch portions of the substrate not covered by the positive pattern.

4 Claims, 2 Drawing Figures

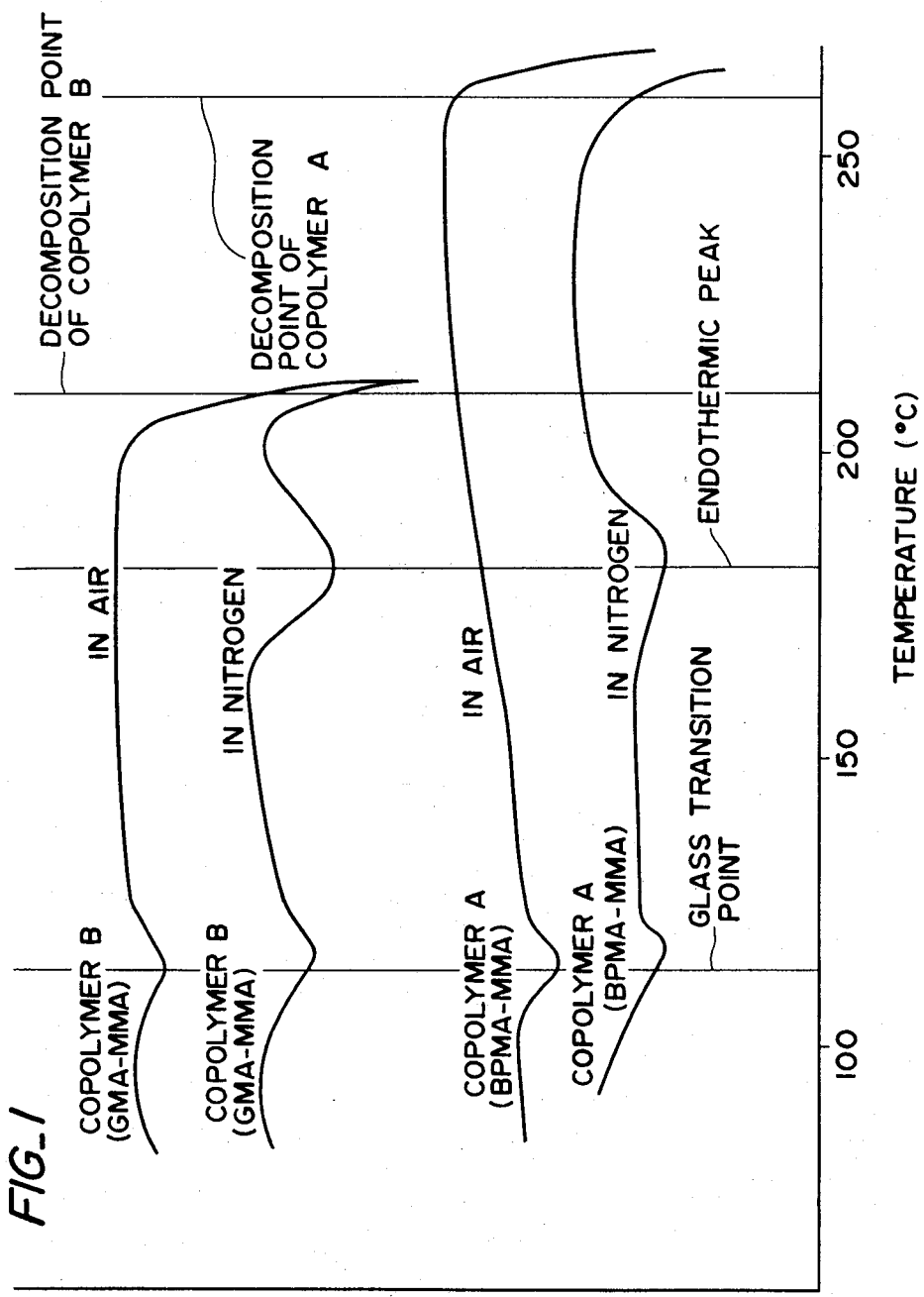
FIG_1

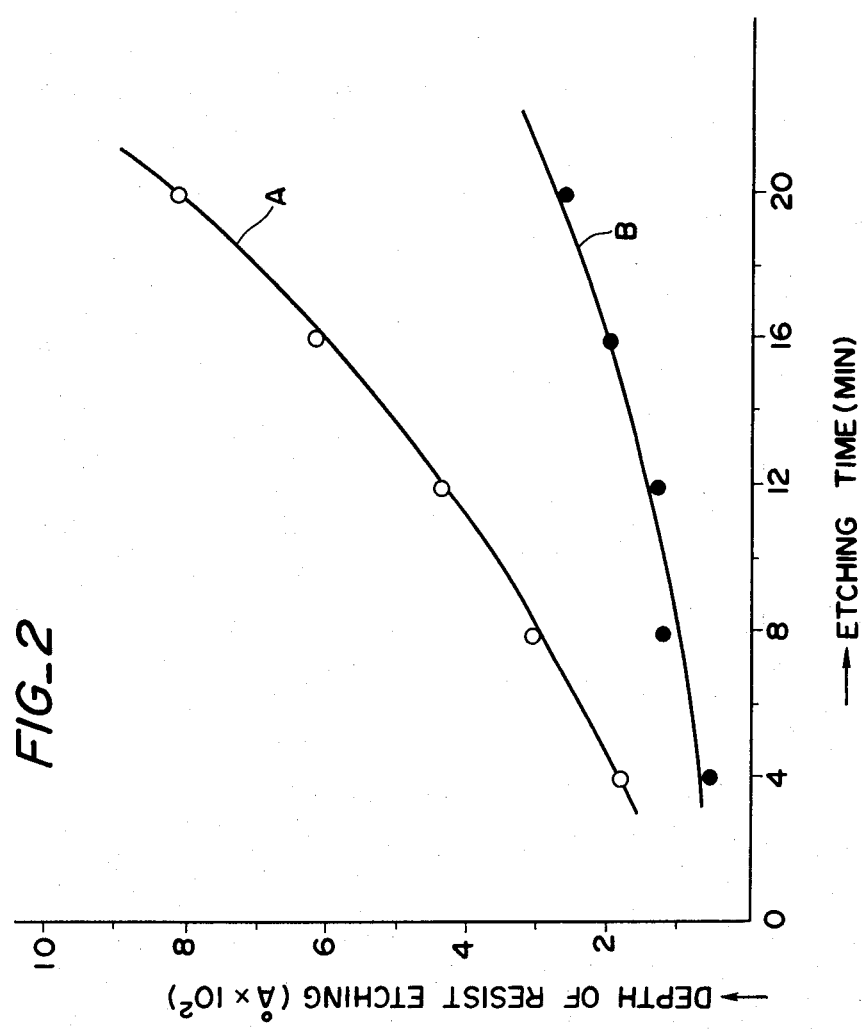

RESISTS AND METHOD OF MANUFACTURING SEMICONDUCTOR ELEMENTS BY USING THE SAME

BACKGROUND OF THE INVENTION

This invention relates to a method of forming a fine resist pattern with ionizing radiations for use in the preparation of semiconductors, magnetic bubble elements, and to optical elements and a resist utilized to form such patterns.

In the manufacture of fine patterns for preparing semiconductor elements ultraviolet ray lithography utilizing a photoresist has generally been used. However, with increase in the packing density of integrated circuits of the semiconductor elements, extremely fine resist patterns are required, so that prior art lithography utilizing a photoresist can not satisfy such requirement.

To solve this problem, lithography utilizing electron beams, X rays or far ultraviolet rays has been proposed, and various resist materials for use in this technique have been developed.

Generally, such polymer type resists as polymethyl methacrylate (PMMA) and polybutene sulphone (PBS) have excellent resolution and can form fine resist patterns. At present, however, when semiconductor substrates are etched by using resist patterns formed on silicone oxide films having a thickness of 1 to 2 microns it is impossible to form satisfactory oxide film patterns. More particularly, in a dry etching process, it has been impossible to form satisfactory patterns because the resistance of PMMA and PBS resists against plasma and ions is not sufficiently high, and moreover, the etching speed of resist films is high. In a wet etching process utilizing hydrofluoric acid type etching solution, the adhesive force between a resist film and an oxide film is not high so that the amount of side etching becomes large thus failing to form satisfactory patterns.

On the other hand, among negative resists, there be mentioned a copolymer of glycidyl methacrylate and ethylacrylate which has an excellent etchant resistant property, but the resolution of such negative resist is poor. Moreover, due to the presence of the residue of the resist or scum it is impossible to form satisfactory resist patterns. As described above, it has long been desired to obtain a resist material capable of forming a fine resist pattern having high resolution and also capable of forming a satisfactory etching pattern by etching an oxide film formed with the resist pattern.

SUMMARY OF THE INVENTION

Accordingly, it is an object of this invention to obtain a novel resist that can fulfill the requirements just mentioned.

Another object of this invention is to provide a method of forming a fine resist pattern by using the novel resist.

According to one aspect of this invention, there is provided a resist which can be utilized to prepare semiconductor elements or the like comprising a copolymer of a first monomer expressed by the formula

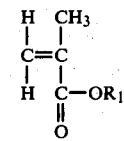

where $R_1$ represents a group containing at least one member selected from the group consisting of bromine, chlorine and an epoxide radical, and a second monomer expressed by the formula

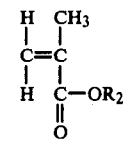

where $R_2$ represents an alkyl radical.

According to another aspect of this invention, there is provided a method of forming a fine pattern on a substrate comprising the steps of preparing a resist consisting of a copolymer of 10–90 mole % of a first monomer expressed by the formula

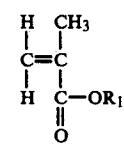

where $R_1$ represents a group containing at least one member selected from the group consisting of bromine, chlorine and an epoxide radical, and 90–10 mole % of a second monomer expressed by the formula

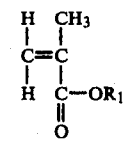

where $R_2$ represents an alkyl radical; applying the copolymer resist onto a substrate to form a copolymer resist layer; irradiating the copolymer resist layer with ionizing radiations; dissolving irradiated portions of the copolymer resist layer to form a positive pattern; heating the resulting assembly in an inert atmosphere to cause a crosslinking reaction of reactive radicals remaining in the copolymer resist; and etching the assembly with a liquid etchant to form an etched pattern on the substrate.

In an alternative method, after the positive pattern has been formed as described above, the positive pattern and the underlying substrate are treated with plasma or ions to cause a crosslinking reaction of reactive radicals remaining in the copolymer resist and to simultaneously etch off portions not covered by the positive pattern.

BRIEF DESCRIPTION OF THE DRAWINGS

In the accompanying drawings:

FIG. 1 is a graph showing the result of thermal analysis of the resist of this invention in air and in an inert atmosphere; and FIG. 2 is a graph showing the relationship between dry etching time and depths of the etching of the resist of this invention and a PMMA resist.

DESCRIPTION OF THE PREFERRED EMBODIMENTS

To have a better understanding of this invention some examples of the invention will be described hereunder, but it should be understood that the invention is not limited to these specific examples.

EXAMPLE 1

In this example, 2,3-dibromo-n-propyl methacrylate $CH_2C(CH_3)CO_2CH_2CHBrCH_2Br$ (BPMA) was used as a first monomer, and methylmethacrylate $CH_2C(CH_3)CO_2CH_3$ (MMA) was used as a second monomer. A copolymer (BPMA-MMA) of these monomers was used as a resist material to be irradiated with ionizing radiations.

At the time of copolymerization, the ratio of respective monomers was varied to obtain copolymers having a constituent ratio of 10–90 mole % of BPMA. In the following description, a copolymer containing 24 mole % of BPMA and 76 mole % of MMA will be discussed. 10 to 30% by weight of this copolymer was dissolved in monochlorobenzene and the resulting solution was coated on an oxide film with a spin coating technique to form a uniform film having a predetermined thickness (less than 1.5 microns). After heating the resulting film at 110° C. for 20 minutes a deuterium lamp or a xenon lamp or a mercury lamp (200 W) was used to irradiate the film with ionizing radiations, for example far ultraviolet rays, through a quartz mask formed with a chromium pattern, and the irradiated film was then developed with a mixed solution containing 60 parts by volume of methylethyl ketone, and 40 parts by volume of isopropyl alcohol to obtain a positive resist pattern having a thickness of 1.5 microns. After heating the positive resist pattern at 110° C. for 20 minutes it was heated further at 180° C. for 30 minutes in inert gas, for example nitrogen atmosphere, for the purpose of enhancing its etchant resistant property. The positive resist pattern was then etched through an etching mask applied thereon with a hydrofluoric acid type etching solution to obtain an etched pattern of an oxide film having a thickness of 1.5 microns and free from any side etching.

In the foregoing Example 1, the reason that an etched pattern of an oxide film having an excellent resolution was obtained by using a BPMA-MMA resist can be attributed to the following fact. When irradiated with far ultraviolet rays the bonds of the main chains of the BPMA-MMA copolymer are cleaved so that the molecular weight of the copolymer decreases with the result that the irradiated portions become easier to dissolve in the developer, thus forming a positive resist pattern. When heated at 180° C. in nitrogen atmosphere, the crosslinking reaction caused by the highly reactive bromine atoms attached to the side chains of BPMA is accelerated so that the resulting resist will have a network construction. This fact was confirmed by the fact that when the heat treated resist pattern was dipped in monochlorobenzene for a long time no dissolution was noted.

FIG. 1 shows the result of thermal analysis of a BPMA-MMA copolymer (copolymer A) in which the abscissa represents the temperature in °C. while the ordinate represents the variation in heat quantity.

As shown in FIG. 1, as a result of the heat treatment in nitrogen, the BPMA-MMA copolymer manifests a new endothermic peak not imparted by heating in air at a temperature between the glass transition point and pyrolysis point, that is, about 180° C. This endothermic peak is caused by the crosslinking reaction and can be proven by the fact that after the copolymer has been heat treated, it becomes insoluble to solvents. It is also considered that concurrently with the crosslinking reaction the adhesive force between the resist and the oxide film increases and this increased adhesive force contributes to the formation of excellent etched pattern with little side etching.

EXAMPLE 2

In this example, glycidyl methacrylate containing epoxy radicals

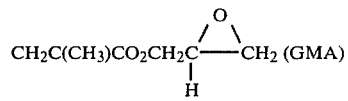

was used as the first monomer. A copolymer of these two monomers (GMA-MMA, copolymer B) was used as a resist to be irradiated with ionizing radiations.

At the time of copolymerization, the ratio of respective monomers was varied to prepare copolymers having a constituent ratio of 10–90 mole % of GMA. In the following description a copolymer containing 30 mole % of GMA and 70 mole % of MMA will be described.

10 to 30% by weight of this copolymer was dissolved in a monochlorobenzene solvent and a film was formed, prebaked and irradiated in the same manner as in Example 1. The film thus treated was developed with methyl isobutyl ketone to obtain a positive resist pattern. This positive pattern was heated at 100° C. for 20 minutes and then heated at 180° C. for 20 minutes in nitrogen atmosphere to obtain a resist pattern having a network construction as in Example 1. The result of thermal analysis of a GMA-MMA copolymer (copolymer B) is also shown in FIG. 1 and it will be noted that copolymer B has a characteristic similar to that of copolymer A. When the oxide film was etched in the same manner as in Example 1, an etched pattern having a thickness of 1 micron was obtained which was free from any side etching.

While in the foregoing examples, a resist pattern was formed on an oxide film to obtain an etched pattern of the oxide film, the invention is not limited to such application, but is also applicable to form a picture image on other substrates, for example a glass plate vapor deposited with chromium. Thus, examples of the substrate which can be used are a polycrystalline silicon film, a silicon oxide film, a silicon nitride film, a phosphosilicate film, an aluminium film, and a chromium film.

According to the method of forming a resist of this invention, it is possible to form a fine resist pattern having excellent resolution and strong adhesive force when the resist is irradiated with ionizing radiations. The resist pattern is used to form an etched pattern on $SiO_2$, or the like. Accordingly, the resist of this invention is suitable to manufacture semiconductor elements including a high density of integrated circuits.

It is a recent trend to substitute dry etching process for wet etching process. As described above, although such positive type resists as polymethylmethacrylate (PMMA) and polybutene sulfone (PBS) can form fine resist patterns having excellent resolution, when resist patterns formed with these positive type resists on a silicon nitride film, a polycrystalline silicon film or an aluminium film on a silicon wafer to a thickness of 1 to 2 microns are dry etched it has been impossible to form excellent patterns. The reason for this is that, when dry etched, the resistance of the PMMA or PBS resist against plasma or ions is not sufficiently high, so that the etching speed of the resist film is high, whereby it is impossible to form accurate patterns.

We have found that the resist of this invention is especially suitable for dry etching to form fine and delicate patterns at high accuracies as demonstrated by the following example.

EXAMPLE 3

In this example, glycidylmethacrylate containing an epoxide radical (hereinafter called GMA)

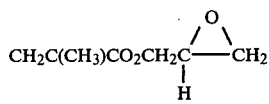

was used as a first monomer, and methylmethacrylate $CH_2C(CH_3)CO_2CH_3$ (MMA) was used as a second monomer. Copolymers of these monomers were used as resist materials to be irradiated with ionizing radiations. The proportion of the GMA in the copolymers was varied from 10 to 90 mole %. In the following a copolymer consisting of 30 mole % of GMA and 70 mole % of MMA will be described as a typical example.

10 to 30% by weight of this copolymer was dissolved in a monochlorobenzene solvent and the resulting solution was coated by a spin coating process on a polycrystalline silicon film having a thickness of 5000 Angstroms to form a film having a uniform thickness of less than 1.5 microns. After heating the film at 130° C. for 30 minutes, it was irradiated with ionizing radiations, for example far ultraviolet rays emitted by a deuterium lamp (200 W) through a quartz mask with a chromium pattern. Then, the irradiated film was developed with a developer consisting of five parts by volume of methylisobutylketone and one part by volume of methylethylketone to obtain a positive pattern having a thickness of 2 microns.

Up to this stage, the process steps are generally the same as those of Examples 1 and 2.

After heating the positive pattern at 110° C. for 30 minutes to evaporate off the solvent, according to this invention, the positive pattern was treated in plasma to effect a crosslinking reaction of the resist layer made of the copolymer and at the same time to etch the substrate. As an example, a polycrystalline silicon with the positive pattern was etched with a cylindrical type plasma apparatus under conditions of 500 W, a frequency of 13.75 MHz and $CF_4$ gas under a pressure of 0.4 Torr to obtain an etched pattern having a thickness of 1 micron. Inspection of the etched section with a scanning type electron microscope showed that the resist does not sag and is not damaged to any appreciable extent.

The result of our research showed that the copolymer resist of this invention contains residual reactive radicals (epoxide radicals, bromine and chlorine) which undergo crosslinking reaction because they are cleaned when treated with plasma or ions, thus greatly reducing the etched amount of the copolymer. On the other hand, it is considered that PMMA immediately decomposes when subjected to plasma or ions thereby enhancing etching. This advantageous feature of the novel resist was confirmed by the fact that the dry etched resist pattern was not dissolved in monochlorobenzene after immersion for a long time. As described above, the copolymer resist containing residual reactive radicals that undergo crosslinking when subjected to plasma or ions has an excellent plasma or ion resistant property which gives an excellent etched pattern.

FIG. 2 compares the etching resistant property of a conventional PMMA resist (curve A) and that of the copolymer resist of this invention (curve B) which were obtained by using $CF_4$ under a pressure of 0.4 Torr, and a radio frequency source having a capacity of 500 W. As FIG. 2 clearly shows, the resistance of the resist of this invention against plasma is high, so that highly accurate patterns can be formed.

What is claimed is:

1. A method of forming a fine pattern on a substrate comprising the steps of preparing a resist consisting essentially of a copolymer of 10–90 mole % of a first monomer of the formula

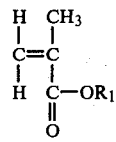

where $R_1$ represents an alkyl group of 1–3 carbon atoms containing at least one member selected from the group consisting of bromine, chlorine and an epoxide radical, and 90–10 mole % of a second monomer of the formula

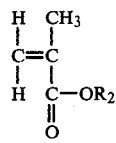

where $R_2$ represents an alkyl radical; applying said copolymer resist onto a substrate to form a copolymer resist layer; irradiating said copolymer resist layer with ionizing radiations; dissolving irradiated portions of said copolymer resist layer to form a positive pattern; heating the resulting assembly in an inert atmosphere at a temperature of about 180° C. for about 20 to 30 minutes to cause a crosslinking reaction of reactive radicals remaining in said copolymer resist; and etching the heated assembly with a liquid etchant to form an etched pattern on said substrate.

2. The method according to claim 1 wherein said heating is at a temperature of 180° C. for 30 minutes.

3. The method according to claim 1 wherein said ionizing radiations are far ultraviolet rays emitted by a deuterium lamp, a xenon lamp or a mercury lamp.

4. The method according to claim 1 wherein said substrate comprises a polycrystalline silicon film, a silicon oxide film, a silicon nitride film, a phosphosilicate film, an aluminium film or a chromium film.

* * * * *